(12) United States Patent
Yao et al.

(10) Patent No.: US 10,658,630 B2
(45) Date of Patent: May 19, 2020

(54) EVAPORATION PLATE FOR DEPOSITING DEPOSITION MATERIAL ON SUBSTRATE, EVAPORATION APPARATUS, AND METHOD OF DEPOSITING DEPOSITION MATERIAL ON SUBSTRATE

(71) Applicants: BOE Technology Group Co., Ltd., Beijing (CN); Hefei Xinsheng Optoelectronics Technology Co., Ltd., Hefei, Anhui (CN)

(72) Inventors: Gu Yao, Beijing (CN); Qinghua Zou, Beijing (CN); Tingyuan Duan, Beijing (CN)

(73) Assignees: BOE Technology Group Co., Ltd., Beijing (CN); Hefei Xinsheng Optoelectronics Technology Co., Ltd., Hefei, Anhui (CN)

( * ) Notice: Subject to any disclaimer, the term of this patent is extended or adjusted under 35 U.S.C. 154(b) by 0 days.

(21) Appl. No.: 16/300,186

(22) PCT Filed: Nov. 1, 2017

(86) PCT No.: PCT/CN2017/108910

§ 371 (c)(1),
(2) Date: Nov. 9, 2018

(87) PCT Pub. No.: WO2019/084840

PCT Pub. Date: May 9, 2019

(65) Prior Publication Data

US 2019/0157631 A1 May 23, 2019

(51) Int. Cl.
*H01L 51/56* (2006.01)
*H01L 51/50* (2006.01)
(Continued)

(52) U.S. Cl.
CPC ............ *H01L 51/56* (2013.01); *C23C 14/042* (2013.01); *C23C 14/24* (2013.01); *C23C 14/541* (2013.01);
(Continued)

(58) Field of Classification Search
CPC ... H01L 51/56; H01L 27/3244; H01L 51/001; H01L 51/5012; H01L 51/0011
(Continued)

(56) References Cited

U.S. PATENT DOCUMENTS

2003/0072876 A1\* 4/2003 Chung ................. C23C 14/042
427/248.1
2003/0228417 A1\* 12/2003 Nishikawa ............ C23C 14/042
427/248.1
(Continued)

FOREIGN PATENT DOCUMENTS

| CN | 102477538 A | 5/2012 |
|---|---|---|
| CN | 203976897 U | 12/2014 |

(Continued)

OTHER PUBLICATIONS

Translation of CN203976897 (Year: 2003).\*
International Search Report & Written Opinion dated Jul. 16, 2018, regarding PCT/CN2017/108910.

*Primary Examiner* — Sheikh Maruf
(74) *Attorney, Agent, or Firm* — Intellectual Valley Law, P.C.

(57) ABSTRACT

The present application discloses an evaporation plate for depositing a deposition material on a substrate. The evaporation plate has a first side and a second side opposite to the first side. The evaporation plate includes a main body plate; a first cooling layer on the main body plate and on the first side of the evaporation plate; and a first heating layer on a side of the first cooling layer distal to the main body plate. The first cooling layer is configured to cool the first heating
(Continued)

layer on the first side of the evaporation plate. The first heating layer is configured to heat a material deposited on the first side of the evaporation plate.

20 Claims, 8 Drawing Sheets

(51) Int. Cl.
    *H01L 27/32*     (2006.01)
    *H01L 51/00*     (2006.01)
    *C23C 14/54*     (2006.01)
    *C23C 14/24*     (2006.01)
    *C23C 14/04*     (2006.01)

(52) U.S. Cl.
    CPC ........ *H01L 27/3244* (2013.01); *H01L 51/001* (2013.01); *H01L 51/5012* (2013.01); *H01L 51/0011* (2013.01)

(58) Field of Classification Search
    USPC .......................................................... 438/23
    See application file for complete search history.

(56) References Cited

U.S. PATENT DOCUMENTS

| | | | | |
|---|---|---|---|---|
| 2006/0071227 A1* | 4/2006 | Brody | ................... | C23C 14/541 257/99 |
| 2008/0260938 A1* | 10/2008 | Ikeda | ................... | C23C 14/042 427/66 |
| 2011/0195186 A1* | 8/2011 | Chen | ....................... | C23C 14/24 427/248.1 |
| 2011/0200741 A1* | 8/2011 | Fukao | ..................... | C23C 14/50 427/66 |
| 2013/0009177 A1* | 1/2013 | Chang | ..................... | C23C 14/12 257/88 |
| 2013/0199445 A1* | 8/2013 | Sonoda | ............... | H01L 51/0011 118/712 |
| 2013/0323882 A1* | 12/2013 | Inoue | .................... | C23C 14/243 438/99 |
| 2013/0334511 A1* | 12/2013 | Savas | ...................... | H01L 51/56 257/40 |
| 2014/0010957 A1* | 1/2014 | Inoue | ..................... | C23C 14/042 427/248.1 |
| 2014/0020628 A1* | 1/2014 | Wang | ................ | H01L 21/02104 118/721 |
| 2016/0122861 A1* | 5/2016 | Kobayashi | ............ | C23C 14/044 118/720 |
| 2018/0066351 A1* | 3/2018 | Liang | ...................... | C23C 14/24 |
| 2018/0258521 A1* | 9/2018 | Inoue | ..................... | H01L 51/50 |
| 2019/0229271 A1* | 7/2019 | Lee | ....................... | H01L 51/0071 |
| 2019/0312220 A1* | 10/2019 | Tsukamoto | ............. | H01L 51/56 |

FOREIGN PATENT DOCUMENTS

| | | |
|---|---|---|
| CN | 104762599 A | 7/2015 |
| TW | 529317 B | 4/2003 |
| TW | 200628618 A | 8/2006 |

* cited by examiner

S2

S1

S1

S2

EVAPORATION PLATE FOR DEPOSITING DEPOSITION MATERIAL ON SUBSTRATE, EVAPORATION APPARATUS, AND METHOD OF DEPOSITING DEPOSITION MATERIAL ON SUBSTRATE

CROSS-REFERENCE TO RELATED APPLICATION

This application is a national stage application under 35 U.S.C. § 371 of International Application No. PCT/CN2017/108910, filed Nov. 1, 2017, the contents of which are incorporated by reference in the entirety.

TECHNICAL FIELD

The present invention relates to display technology, more particularly, to an evaporation plate for depositing a deposition material on a substrate, an evaporation apparatus, and a method of depositing a deposition material on a substrate.

BACKGROUND

In a conventional process of making an organic light emitting diode (OLED), the organic light emitting material is evaporated onto a substrate using an evaporation crucible. Specifically, the organic light emitting material is placed inside the evaporation crucible having a heating source. When power is applied to the heating source, the organic light emitting material evaporates or sublimes into a vapor. The evaporated or sublimed vapor condenses when it reaches the substrate on top of the evaporation crucible. The organic light emitting material is deposited on the substrate.

SUMMARY

In one aspect, the present disclosure provides an evaporation plate for depositing a deposition material on a substrate, the evaporation plate having a first side and a second side opposite to the first side, comprising a main body plate; a first cooling layer on the main body plate and on the first side of the evaporation plate; and a first heating layer on a side of the first cooling layer distal to the main body plate; wherein the first cooling layer is configured to cool the first heating layer on the first side of the evaporation plate; and the first heating layer is configured to heat a material deposited on the first side of the evaporation plate.

Optionally, the evaporation plate further comprises a second cooling layer on the main body plate and on the second side of the evaporation plate; and a second heating layer on a side of the second cooling layer distal to the main body plate; wherein the second cooling layer is configured to cool the second heating layer on the second side of the evaporation plate; and the second heating layer is configured to heat a material deposited on the second side of the evaporation plate.

Optionally, the evaporation plate further comprises a first heat spreading layer on a side of the first heating layer distal to the first cooling layer, and configured to distribute heat transmitted from the first heating layer; and a second heat spreading layer on a side of the second heating layer distal to the second cooling layer, and configured to distribute heat transmitted from the second heating layer; wherein the first cooling layer is configured to cool the first heating layer and the first heat spreading layer on the first side of the evaporation plate; the first heating layer is configured to heat a material deposited on the first heat spreading layer through the first heat spreading layer; the second cooling layer is configured to cool the second heating layer and the second spreading layer on the second side of the evaporation plate; and the second heating layer is configured to heat a material deposited on the second heat spreading layer through the second heat spreading layer.

Optionally, the evaporation plate further comprises a pivot configured to rotate the evaporation plate between a first position and a second position.

In another aspect, the present disclosure provides an evaporation apparatus comprising the evaporation plate described herein or fabricated by a method described herein.

Optionally, the evaporation apparatus further comprises a plurality of nozzles configured to spread an evaporated deposition material onto the evaporation plate.

Optionally, the evaporation plate further comprises a second cooling layer on the main body plate and on the second side of the evaporation plate; and a second heating layer on a side of the second cooling layer distal to the main body plate; wherein the second cooling layer is configured to cool the second heating layer on the second side of the evaporation plate; and the second heating layer is configured to heat a material deposited on the second side of the evaporation plate.

Optionally, the evaporation plate further comprises a first heat spreading layer on a side of the first heating layer distal to the first cooling layer, and configured to distribute heat transmitted from the first heating layer; and a second heat spreading layer on a side of the second heating layer distal to the second cooling layer, and configured to distribute heat transmitted from the second heating layer; wherein the first cooling layer is configured to cool the first heating layer and the first heat spreading layer on the first side of the evaporation plate; the first heating layer is configured to heat a material deposited on the first heat spreading layer through the first heat spreading layer; the second cooling layer is configured to cool the second heating layer and the second spreading layer on the second side of the evaporation plate; and the second heating layer is configured to heat a material deposited on the second heat spreading layer through the second heat spreading layer.

Optionally, the evaporation plate is configured to rotate between a first position and a second position; wherein the plurality of nozzles face the first side of the evaporation plate when the evaporation plate is at the first position, and are configured to spread the evaporated deposition material onto the first side of the evaporation plate at the first position; and the plurality of nozzles face the second side of the evaporation plate when the evaporation plate is at the second position, and are configured to spread the evaporated deposition material onto the second side of the evaporation plate at the second position.

Optionally, the second heating layer is configured to heat a deposition material spread on the second side of the evaporation plate when the evaporation plate is at the first position; and the first heating layer is configured to heat a deposition material spread on the first side of the evaporation plate when the evaporation plate is at the second position.

Optionally, the evaporation apparatus further comprises a pivot coupled to the evaporation plate and configured to rotate the evaporation plate between the first position and the second position.

Optionally, the evaporation apparatus further comprises a deposition-preventing plate between the evaporation plate and the plurality of nozzles; wherein the deposition-preventing plate has an opening exposing the evaporation plate: the plurality of nozzles are movable relative to the opening; and deposition of the evaporated deposition material on the evaporation plate is prevented when the plurality of nozzles are outside a region corresponding to the opening.

In another aspect, the present disclosure provides a method of depositing a deposition material on a substrate, comprising providing the evaporation apparatus described herein or fabricated by a method described herein; setting the evaporation plate to the first position, at which the plurality of nozzles face the first side of the evaporation plate: and depositing the evaporated deposition material from the plurality of nozzles onto the first side of the evaporation plate at the first position, thereby forming a first deposition material layer.

Optionally, the method further comprises setting the evaporation plate to the second position, at which the plurality of nozzles face the second side of the evaporation plate; and depositing the evaporated deposition material from the plurality of nozzles onto the second side of the evaporation plate at the second position, thereby forming a second deposition material layer.

Optionally, the evaporation apparatus further comprises a deposition-preventing plate between the evaporation plate and the plurality of nozzles; the deposition-preventing plate has an opening exposing the evaporation plate; the plurality of nozzles are movable relative to the opening; deposition of the evaporated deposition material on the evaporation plate is prevented when the plurality of nozzles are outside a region corresponding to the opening; wherein subsequent to forming the first deposition material layer and prior to setting the evaporation plate to the second position, the method further comprises moving the plurality of nozzles outside the region corresponding to the opening.

Optionally, the method further comprises providing a first substrate on a side of the first heating layer distal to the main body plate; providing a first mask plate on a side of the first substrate proximal to the first heating layer; heating the first heating layer when the evaporation plate is at the second position to heat the first deposition material layer to a temperature such that a first deposition material in the first deposition material layer is evaporated; and depositing the first deposition material on the first substrate.

Optionally, subsequent to depositing the first deposition material, the method further comprises cooling the first cooling layer to lower the temperature of the first heating layer; setting the evaporation plate to the first position; and depositing the evaporated deposition material from the plurality of nozzles onto the first side of the evaporation plate at the first position, thereby forming a first deposition material layer.

Optionally, the method further comprises providing a second substrate on a side of the second heating layer distal to the main body plate; providing a second mask plate on a side of the second substrate proximal to the second heating layer; heating the second heating layer when the evaporation plate is at the first position to heat the second deposition material layer to a temperature such that a second deposition material in the second deposition material layer is evaporated; and depositing the second deposition material on the second substrate.

In another aspect, the present disclosure provides a display apparatus, wherein at least one layer of the display apparatus is fabricated by the method described herein.

Optionally, the display apparatus is an organic light emitting diode display apparatus, and the at least one layer comprises an organic light emitting layer.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
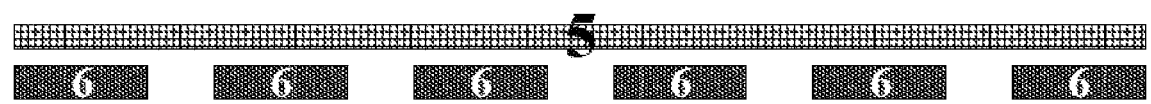
FIG. 1 is a schematic diagram of a side view of an evaporation apparatus in some embodiments according to the present disclosure.
Figure 1:
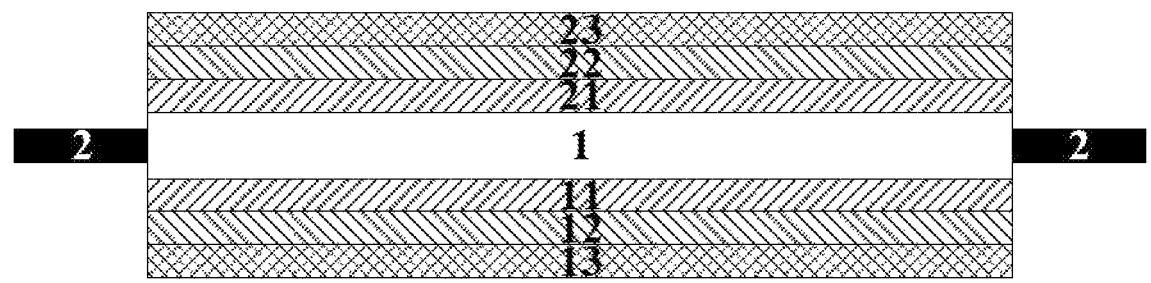
Figure 1:
Figure 1:
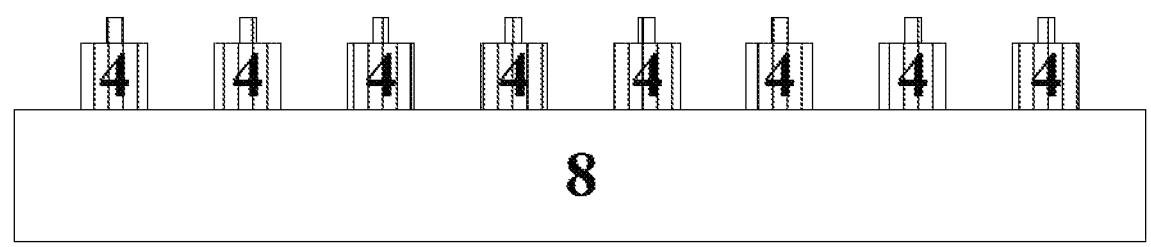

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In the conventional process of depositing a deposition material on a substrate, the deposition material is evaporated from a plurality of nozzles, then condensed on the surface of the substrate. The vapor leaving the plurality of nozzles reaches the surface of the substrate at a certain angle not perpendicular to the surface of the substrate. Moreover, often there is a small gap between the mask plate placed on top of the substrate and the substrate due to the limitations of the fabrication process. It is discovered in the present disclosure that, due to these limitations, a deposition layer formed on the substrate is slightly larger than the opening of the mask plate by a shadow distance, and the edges of the layer is thinner than the central portion of the layer. The existence of the shadow distance severely affects the resolution of the display apparatus. When making a high pixel-per-inch (PPI) display apparatus, this issue sometimes results in color mixing between adjacent subpixels, as well as light leakage.

Accordingly, the present disclosure provides, inter alia, an evaporation plate for depositing a deposition material on a substrate, an evaporation apparatus, and a method of depositing a deposition material on a substrate that substantially obviate one or more of the problems due to limitations and disadvantages of the related art. In one aspect, the present disclosure provides an evaporation plate for depositing a deposition material on a substrate. The evaporation plate has a first side and a second side opposite to the first side. In some embodiments, the evaporation plate includes a main body plate; a first cooling layer on the main body plate and on the first side of the evaporation plate; and a first heating layer on a side of the first cooling layer distal to the main body plate. Optionally, the first cooling layer is configured to cool the first heating layer on the first side of the evaporation plate. Optionally, the first heating layer is configured to heat a material deposited on the first side of the evaporation plate. Optionally, the evaporation plate further includes a second cooling layer on the main body plate and on the second side of the evaporation plate; and a second heating layer on a side of the second cooling layer distal to the main body plate. Optionally, the second cooling layer is configured to cool the second heating layer on the second side of the evaporation plate. Optionally, the second heating layer is configured to heat a material deposited on the second side of the evaporation plate. A display apparatus having a layer fabricated by the present evaporation plate obviates the shadow distance issue, resulting in higher display quality and performance of the display apparatus.

FIG. 1 is a schematic diagram of a side view of an evaporation apparatus in some embodiments according to the present disclosure. Referring to FIG. 1, the evaporation apparatus in some embodiments includes an evaporation plate 100 for depositing a deposition material on a substrate 5 using a mask plate 6. As shown in FIG. 1, the evaporation plate 100 in some embodiments has a first side S1 and a second side S2 opposite to the first side S1. The evaporation plate 100 includes a main body plate 1; a first cooling layer 11 on the main body plate 1 and on the first side S1 of the evaporation plate 100; and a first heating layer 12 on a side of the first cooling layer 11 distal to the main body plate 1. Optionally, the first cooling layer 11 is configured to cool the first side S1 of the evaporation plate 100. For example, the first cooling layer 11 is configured to cool the first heating layer 12 (and other layers) on the first side S1 of the evaporation plate 100. Optionally, the first heating layer 12 is configured to heat the first side S1 of the evaporation plate 100. By heating the first side S1 of the evaporation plate 100, the first heating layer 12 can heat a deposition material deposited on the first side S1 of the evaporation plate 100.

In some embodiment, the evaporation plate 100 further includes a second cooling layer 21 on the main body plate 1 and on the second side S2 of the evaporation plate 100; and a second heating layer 22 on a side of the second cooling layer 21 distal to the main body plate 1. Optionally, the second cooling layer 21 is configured to cool the second side S2 of the evaporation plate 100. For example, the second cooling layer 21 is configured to cool the second heating layer 22 on the second side S2 of the evaporation plate 100. Optionally, the second heating layer is configured to heat the second side S2 of the evaporation plate 100. By heating the second side S2 of the evaporation plate 100, the second heating layer 22 can heat a deposition material deposited on the second side S2 of the evaporation plate 100.

In some embodiments, the evaporation plate 100 further includes a first heat spreading layer 13 on a side of the first heating layer 12 distal to the first cooling layer 11. The first heat spreading layer 13 is configured to distribute heat transmitted from the first heating layer 12. For example, when the first heating layer 12 is heating the first side S1 of the evaporation plate 100, the first heat spreading layer 13 can evenly distribute heat transmitted from the first heating layer 12 on a surface of the first heat spreading layer 13, thereby evenly heating a deposition material deposited on the first side S1 of the evaporation plate 100. When the first cooling layer 11 is cooling the first side S1 of the evaporation plate 100, the first cooling layer 11 is configured to cool the first heating layer 12 and the first spreading layer 13 on the first side S1 of the evaporation plate 100. When the first heating layer 12 is heating the first side S1 of the evaporation plate 100, the first heating layer 12 is configured to heat a deposition material deposited on the first heat spreading layer 13 through the first heat spreading layer 13.

In some embodiments, the evaporation plate 100 further includes a second heat spreading layer 23 on a side of the second heating layer 22 distal to the second cooling layer 21. The second heat spreading layer 23 is configured to distribute heat transmitted from the second heating layer 22. For example, when the second heating layer 22 is heating the second side S2 of the evaporation plate 100, the second heat spreading layer 23 can evenly distribute heat transmitted from the second heating layer 22 on a surface of the second heat spreading layer 23, thereby evenly heating a deposition material deposited on the second side S2 of the evaporation plate 100. When the second cooling layer 21 is cooling the second side S2 of the evaporation plate 100, the second cooling layer 21 is configured to cool the second heating layer 22 and the second spreading layer 23 on the second side S2 of the evaporation plate 100. When the second beating layer 22 is heating the second side S2 of the evaporation plate 100, the second heating layer 22 is configured to heat a deposition material deposited on the second heat spreading layer 23 through the second heat spreading layer 23.

Figure 2:
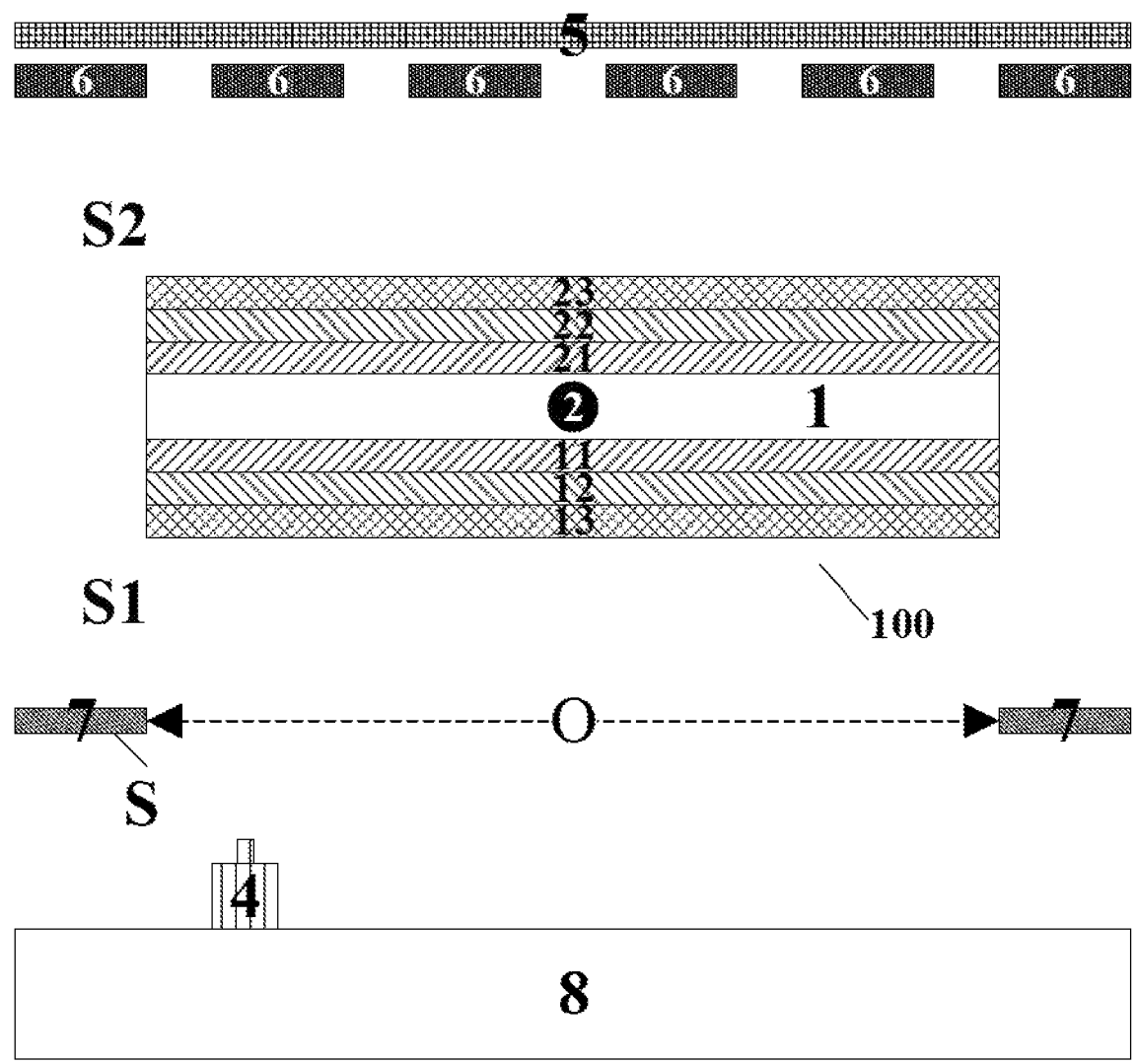
FIG. 2 is a schematic diagram of a front view of an evaporation apparatus in some embodiments according to the present disclosure.

In some embodiments, the evaporation plate 100 is configured to rotate between a first position and a second position. For example, the evaporation plate 100 in some embodiments further includes a pivot 2 configured to rotate the evaporation plate 100 between a first position and a second position. Referring to FIG. 1 and FIG. 2, the evaporation apparatus in some embodiments further includes a plurality of nozzles 4 movable on a platform 8 and configured to spread an evaporated deposition material onto the evaporation plate 100. FIG. 1 and FIG. 2 show an evaporation apparatus in which the evaporation plate 100 is at the first position. When the evaporation plate 100 is at the first position, the plurality of nozzles 4 face the first side S1 of the evaporation plate 100, and are configured to spread the evaporated deposition material onto the first side S1 of the evaporation plate 100 at the first position. When the evaporation plate 100 is at the first position, the second heating layer 22 is configured to heat a deposition material spread on the second side S2 of the evaporation plate 100, e.g., a deposition material spread on the second heat spreading layer 23 of the evaporation plate 100.

Figure 3:
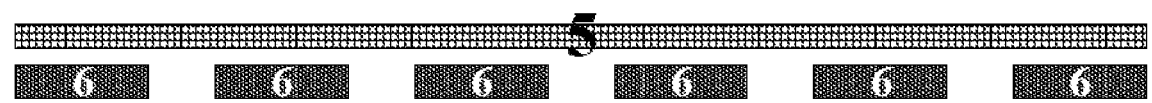
FIG. 3 is a schematic diagram of a front view of an evaporation apparatus in some embodiments according to the present disclosure.
Figure 3:
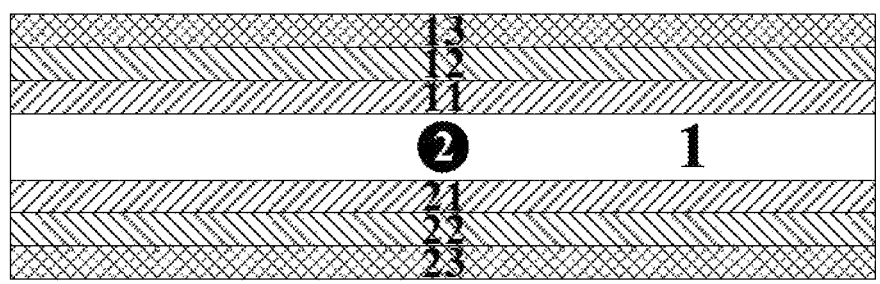
Figure 3:
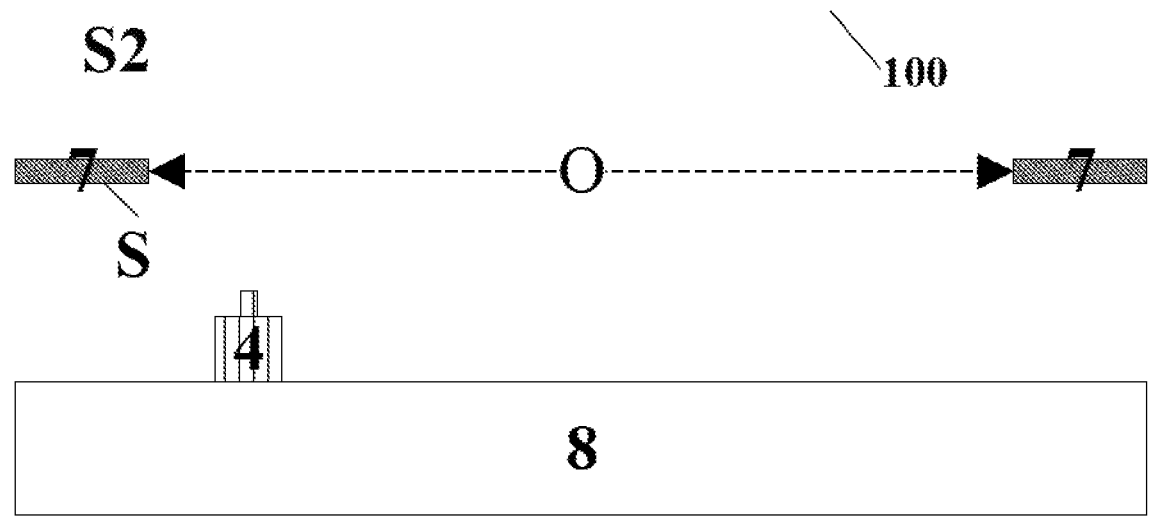

FIG. 3 is a schematic diagram of a front view of an evaporation apparatus in some embodiments according to the present disclosure. FIG. 3 shows an evaporation apparatus in which the evaporation plate 100 is at the second position. When the evaporation plate 100 is at the second position, the plurality of nozzles 4 face the second side S2 of the evaporation plate 100, and are configured to spread the evaporated deposition material onto the second side S2 of the evaporation plate 100 at the second position. When the evaporation plate 100 is at the second position, the first heating layer 12 is configured to heat a deposition material spread on the first side S1 of the evaporation plate 100, e.g., a deposition material spread on the first heat spreading layer 13 of the evaporation plate 100.

Referring to FIGS. 1 to 3, the evaporation apparatus in some embodiments further includes a deposition-preventing plate 7 between the evaporation plate 100 and the plurality of nozzles 4. The deposition-preventing plate 7 has a shielding plate S and an opening O exposing the evaporation plate 100. The plurality of nozzles 4 are movable relative to the opening O. Deposition of the evaporated deposition material on the evaporation plate 100 is prevented when the plurality of nozzles 4 are outside a region corresponding to the opening O, e.g., when the plurality of nozzles 4 are moved underneath the shielding plate S.

In another aspect, the present disclosure provides a method of depositing a deposition material on a substrate. In some embodiments, the method includes providing the evaporation apparatus described herein, setting the evaporation plate to the first position, at which the plurality of nozzles face the first side of the evaporation plate, and depositing the evaporated deposition material from the plurality of nozzles onto the first side of the evaporation plate at the first position, thereby forming a first deposition material layer. Optionally, the method further includes setting the evaporation plate to the second position, at which the plurality of nozzles face the second side of the evaporation plate; and depositing the evaporated deposition material from the plurality of nozzles onto the second side of the evaporation plate at the second position, thereby forming a second deposition material layer. Optionally, subsequent to forming the first deposition material layer and prior to setting the evaporation plate to the second position, the method further includes moving the plurality of nozzles outside the region corresponding to the opening.

In some embodiments, the method further includes providing a first substrate on a side of the first heat heating layer distal to the main body plate; providing a first mask plate on a side of the first substrate proximal to the first heating layer; heating the first heating layer when the evaporation plate is at the second position to heat the first deposition material layer to a temperature such that a first deposition material in the first deposition material layer is evaporated and depositing the first deposition material on the first substrate.

Optionally, subsequent to depositing the first deposition material, the method further includes cooling the first cooling layer to lower the temperature of the first heating layer; setting the evaporation plate to the first position, and depositing the evaporated deposition material from the plurality of nozzles onto the first side of the evaporation plate at the first position, thereby forming a first deposition material layer.

In some embodiments, the method further includes providing a second substrate on a side of the second heating layer distal to the main body plate; providing a second mask plate on a side of the second substrate proximal to the second heating layer; heating the second heating layer when the evaporation plate is at the first position to heat the second deposition material layer to a temperature such that a second deposition material in the second deposition material layer is evaporated; and depositing the second deposition material on the second substrate.

Figure 4:
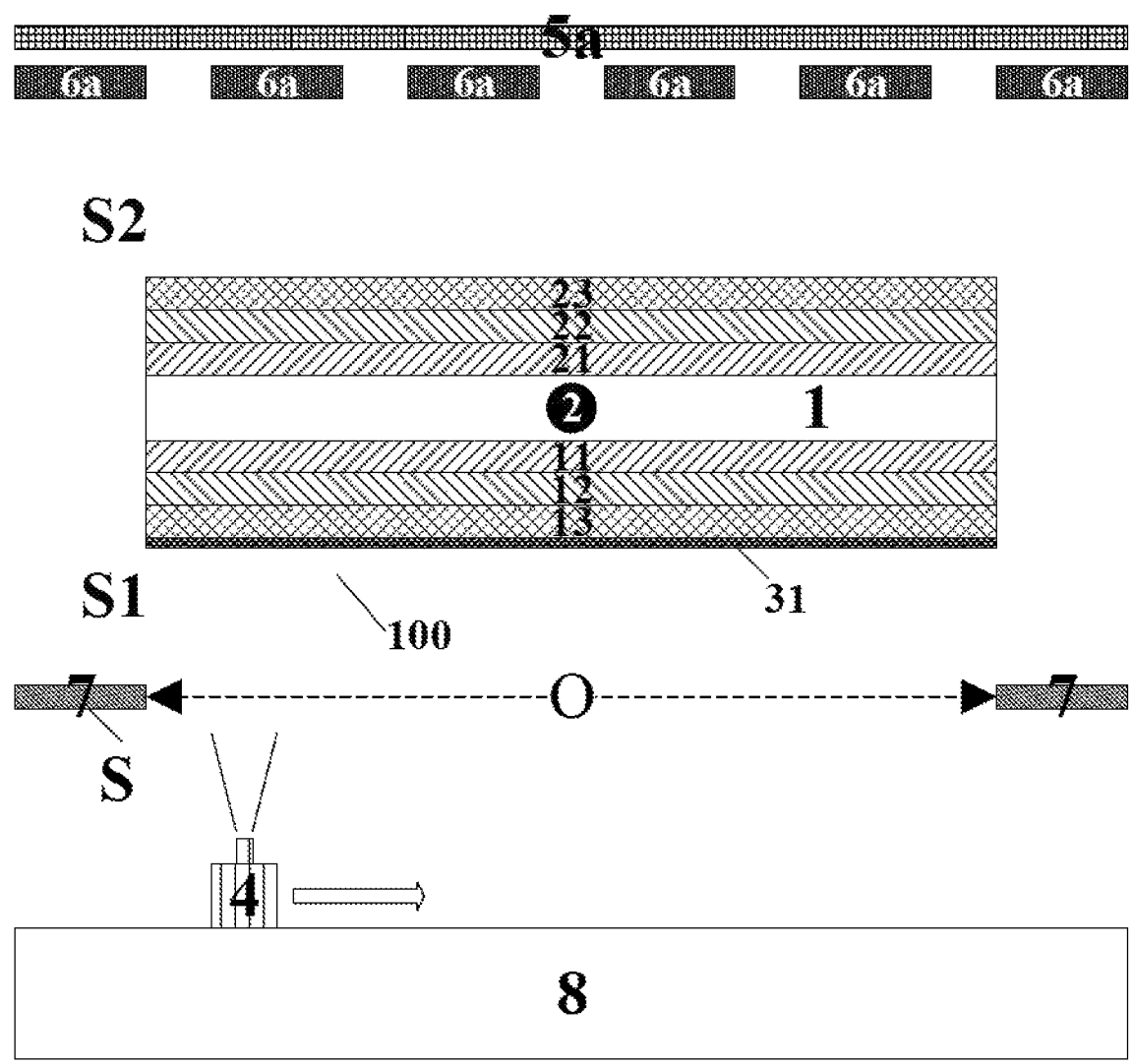
FIGS. 4 to 8 illustrate a process of depositing a deposition material on a substrate in some embodiments according to the present disclosure.

FIGS. 4 to 7 illustrate a process of depositing a deposition material on a substrate in some embodiments according to the present disclosure. Referring to FIG. 4, the evaporation plate is rotated to the first position, at which the plurality of nozzles 4 face the first side S1 of the evaporation plate 100. An evaporated deposition material is deposited from the plurality of nozzles 4 onto the first side S1 of the evaporation plate 100 at the first position. As shown in FIG. 4, the plurality of nozzles 4 move from the left side to the right side. A first deposition material layer 31 is formed on a surface of the first heat spreading layer 13 as the plurality of nozzles 4 moving from the left side to the right side.

Figure 5:
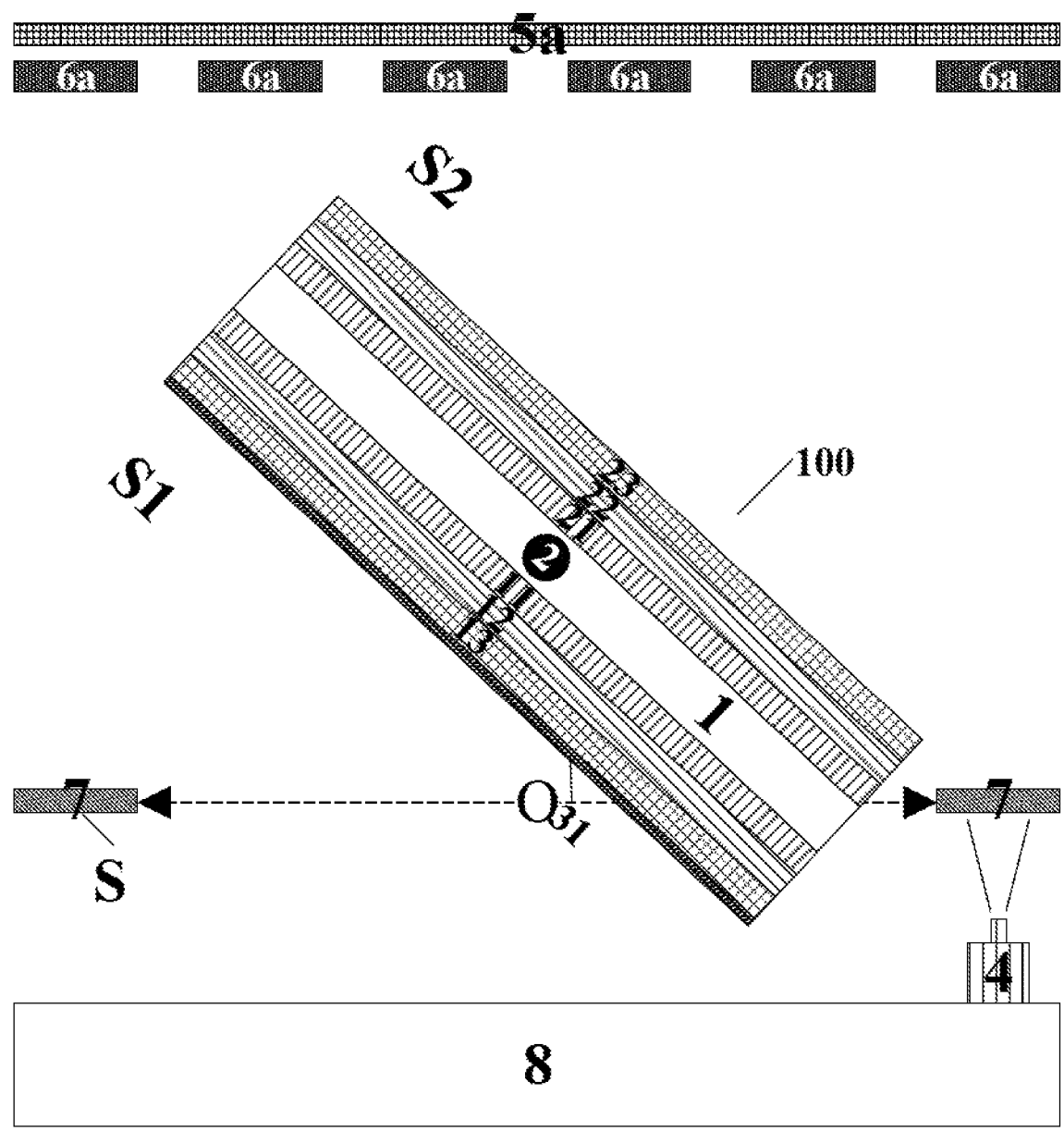

Referring to FIG. 5, subsequent to forming the first deposition material layer 31 on the surface of the first heat spreading layer 13, the plurality of nozzles 4 are moved underneath the shielding plate S of the deposition-preventing plate 7, e.g., outside the region corresponding to the opening O. The evaporation plate 100 is rotated to set the evaporation plate 100 from the first position to the second position. During the rotation process, the first heating layer 12 begins to pre-heat the first side S1 of the evaporation plate 100, e.g., to a temperature lower than the evaporation temperature of the deposition material in the first deposition material layer 31. A first substrate 5a and a first mask plate 6a (from a side opposite to the plurality of nozzles 4) is placed on in position ready for deposition. The first mask plate 6a is aligned with the first substrate 5a so that the openings in the first mask plate 6a correspond to the desired positions for material deposition in the first substrate 5a.

Figure 6:
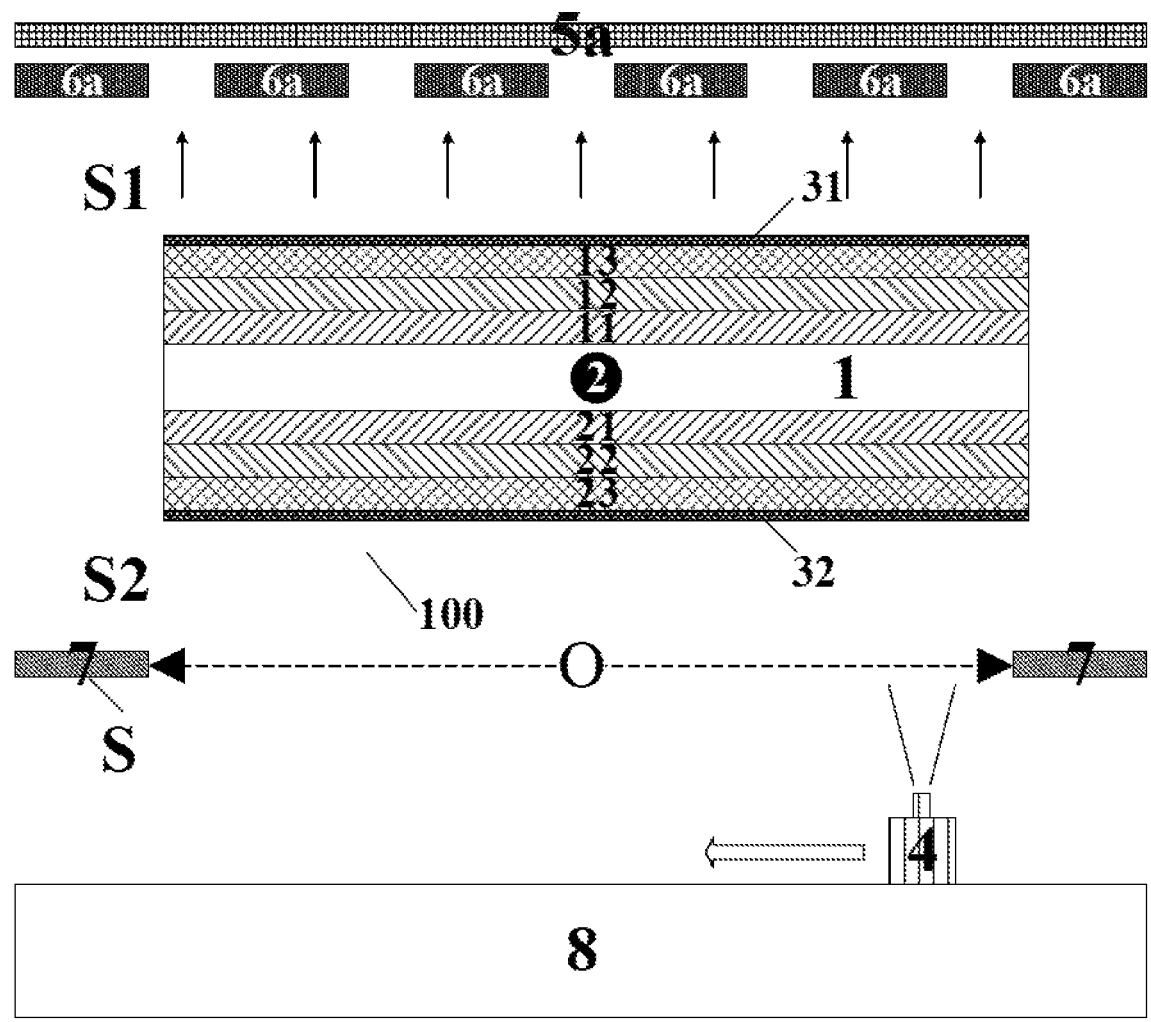

Referring to FIG. 6, the evaporation plate 100 is set at the second position. At the second position, the first side S1 of the evaporation plate 100 faces the first mask plate 6a and the first substrate 5a, and the second side S2 of the evaporation plate 100 faces the plurality of nozzles 4. At the second position, an evaporated deposition material is deposited from the plurality of nozzles 4 onto the second side S2 of the evaporation plate 100. As shown in FIG. 6, the plurality of nozzles 4 move from the right side to the left side. A second deposition material layer 32 is formed on a surface of the second heat spreading layer 23 as the plurality of nozzles 4 moving from the right side to the left side.

When the evaporation plate 100 is at the second position, the first heating layer 12 heats the first deposition material layer 31 (now facing the first mask plate 6a and the first substrate 5a) further to a temperature such that a first deposition material in the first deposition material layer 31 is evaporated. The evaporated deposition material from the first deposition material layer 31 is deposited on the first substrate 5a. In the present method, the deposition material is evaporated from a plane (e.g., a plane of the first deposition material layer 31). The vapor reaches the first substrate 5a along a direction substantially perpendicular to the surface of the first substrate 5a. As a result, the deposition material can be precisely and accurately deposited into the desired positions in the first substrate 5a, e.g., without a shadow distance.

Figure 7:
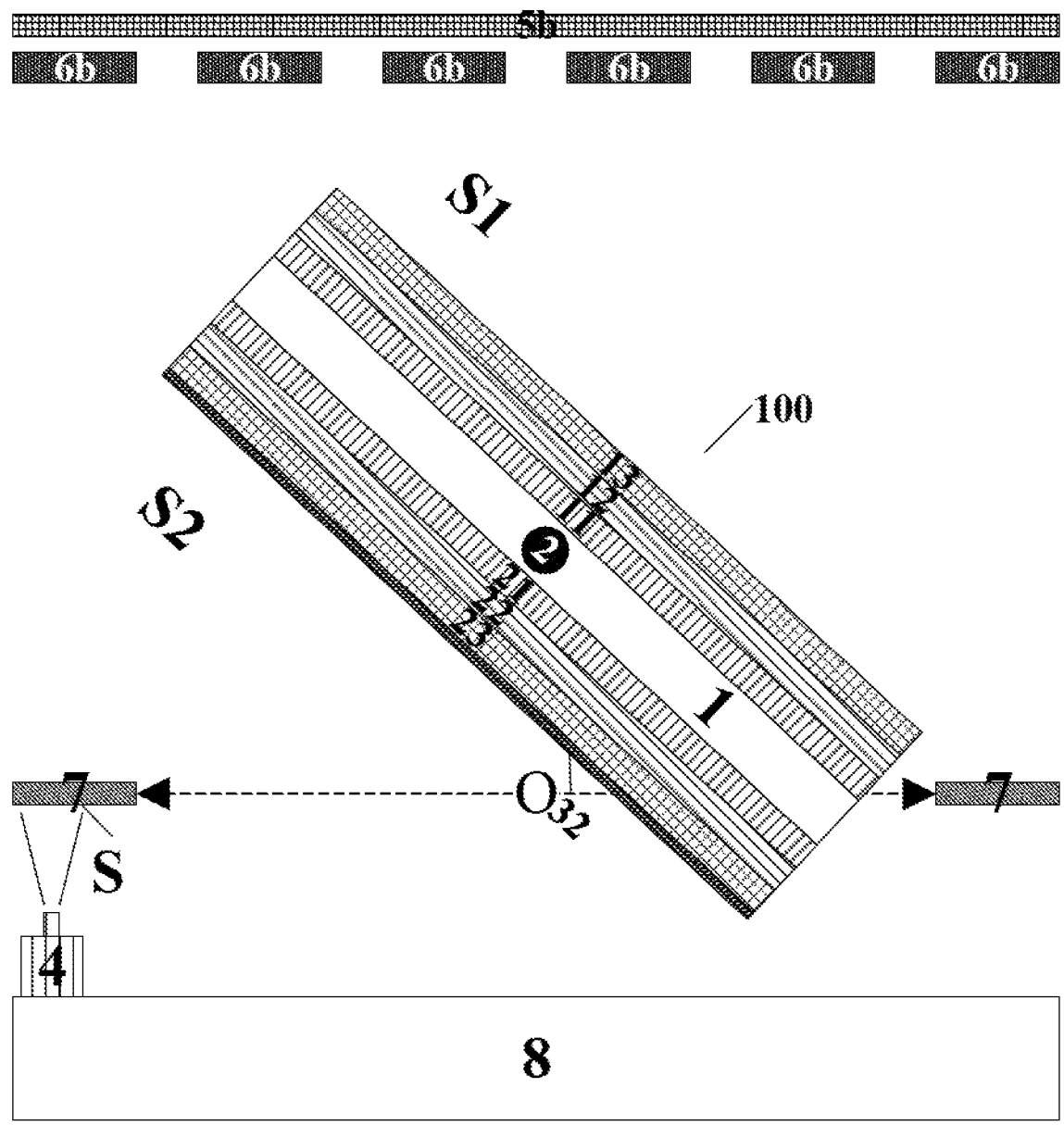

Referring to FIG. 7, subsequent to forming the second deposition material layer 32 on the surface of the second heat spreading layer 23, the plurality of nozzles 4 are moved underneath the shielding plate S of the deposition-preventing plate 7, e.g., outside the region corresponding to the opening O. The evaporation plate 100 is rotated to set the evaporation plate 100 from the second position to the first position. During the rotation process, the second heating layer 22 begins to pre-heat the second side S2 of the evaporation plate 100, e.g., to a temperature lower than the evaporation temperature of the deposition material in the second deposition material layer 32. The first substrate 5a and the first mask plate 6a are removed after the material deposition on the first substrate 5a is complete. A second substrate 5b and a second mask plate 6b (from a side opposite to the plurality of nozzles 4) is placed on in position ready for deposition. The second mask plate 6b is aligned with the second substrate 5b so that the openings in the second mask plate 6b correspond to the desired positions for material deposition in the second substrate 5b. Moreover, during the rotation process, the first heating layer 12 stops heating the first side S1 of the evaporation plate 100, and the first cooling layer 11 starts to cool down the first side S1 of the evaporation plate 100.

Figure 8:
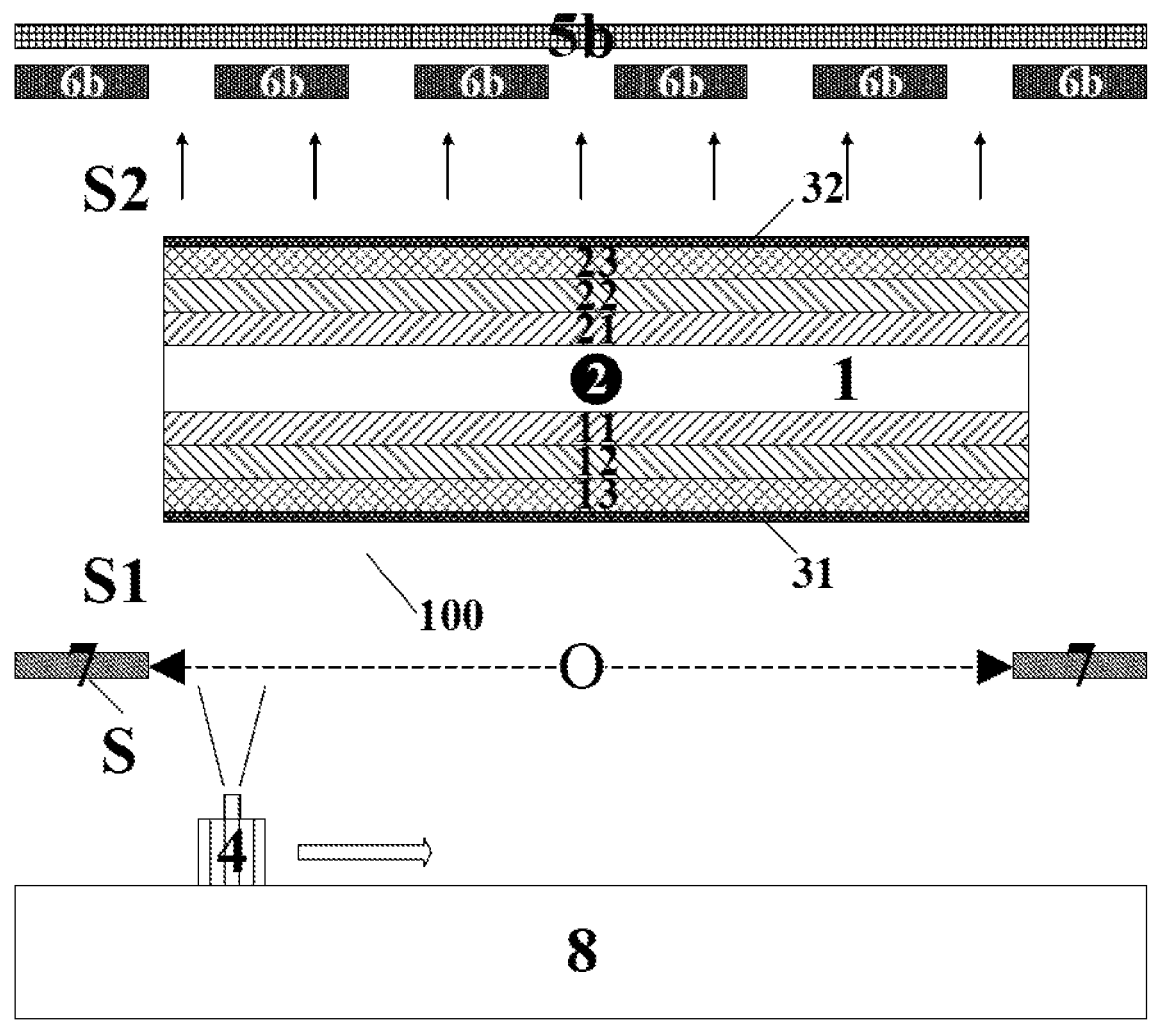

Referring to FIG. 8, the evaporation plate 100 is set at the first position. At the first position, the second side S2 of the evaporation plate 100 faces the second mask plate 6b and the second substrate 5b, and the first side S1 of the evaporation plate 100 faces the plurality of nozzles 4. At the first position, an evaporated deposition material is deposited from the plurality of nozzles 4 onto the first side S1 of the evaporation plate 100. As shown in FIG. 8, the plurality of nozzles 4 move from the left side to the right side. A first deposition material layer 31 is formed on a surface of the first heat spreading layer 13 as the plurality of nozzles 4 moving from the left side to the right side.

When the evaporation plate 100 is at the first position, the second heating layer 22 heats the second deposition material layer 32 (now facing the second mask plate 6b and the second substrate 5b) further to a temperature such that a second deposition material in the second deposition material layer 32 is evaporated. The evaporated deposition material from the second deposition material layer 32 is deposited on the second substrate 5b. In the present method, the deposition material is evaporated from a plane (e.g., a plane of the second deposition material layer 32). The vapor reaches the second substrate 5b along a direction substantially perpendicular to the surface of the second substrate 5b. As a result, the deposition material can be precisely and accurately deposited into the desired positions in the second substrate 5b, e.g., without a shadow distance.

Optionally, the process as shown in FIGS. 4 to 8 can be reiterated for a plurality of times.

In another aspect, the present disclosure provides a display apparatus having at least one layer that is fabricated by the method described herein. Optionally, the display apparatus is an organic light emitting diode display apparatus. Optionally, the at least one layer includes an organic light emitting layer. Optionally, the at least one layer include an organic functional layer in the organic light emitting diode display apparatus, e.g., a hole injection layer, a hole transport layer, an electron injection layer, and an electron transport layer. Examples of appropriate display apparatuses include, but are not limited to, an electronic paper, a mobile phone, a tablet computer, a television, a monitor, a notebook computer, a digital album, a GPS, etc.

In another aspect, the present disclosure provides a method of fabricating an evaporation plate for depositing a deposition material on a substrate. In some embodiments, the method includes providing a main body plate; forming a first cooling layer on the main body plate and on a first side of the main body plate; and forming a first heating layer on a side of the first cooling layer distal to the main body plate. Optionally, the method further includes forming a second cooling layer on the main body plate and on a second side of the main body plate, the second side opposite to the first side; and forming a second heating layer on a side of the second cooling layer distal to the main body plate.

Optionally, the method further includes forming a first heat spreading layer on a side of the first heating layer distal to the first cooling layer. Optionally, the method further includes forming a second heat spreading layer on a side of the second heating layer distal to the second cooling layer.

Optionally, the method further includes forming a pivot configured to rotate the evaporation plate between a first position and a second position.

In another aspect, the present disclosure provides a method of fabricating an evaporation apparatus. In some embodiments, the method includes providing an evaporation plate described herein or fabricated by a method described herein; and providing a plurality of nozzles. The evaporation plate is configured to rotate between a first position and a second position. The evaporation plate and the plurality of nozzles are assembled so that the plurality of nozzles face the first side of the evaporation plate when the evaporation plate is at the first position, and the plurality of nozzles face the second side of the evaporation plate when the evaporation plate is at the second position.

In some embodiments, the method further includes forming a deposition-preventing plate between the evaporation plate and the plurality of nozzles. Optionally, the deposition-preventing plate is formed to have an opening exposing the evaporation plate. The plurality of nozzles are formed to be movable relative to the opening. Optionally, when the plurality of nozzles are moved outside a region corresponding to the opening, deposition of the evaporated deposition material on the evaporation plate is prevented by the deposition-preventing plate.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention". "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An evaporation plate for depositing a deposition material on a substrate, comprising a sequentially stacked structure:
  wherein the sequentially stacked structure comprises:
    a first heating layer;
    a first cooling layer;
    a main body plate;
    a second cooling layer; and
    a second heating layer;
  wherein the first cooling layer and the first heating layer are sequentially stacked on a first side of the main body plate;
  the second cooling layer and the second heating layer are sequentially stacked on a second side of the main body plate;
  the second side is opposite to the first side;
  the main body plate is between the first cooling layer and the second cooling layer;
  the first cooling layer is between the first heating layer and the main body plate, and is configured to cool the first heating layer on the first side of the main body plate;
  the first heating layer is configured to heat a first material deposited on the first side of the main body plate;
  the second cooling layer is between the second heating layer and the main body plate, and is configured to cool the second heating layer on the second side of the main body plate; and the second heating layer is configured to heat a second material deposited on the second side of the main body plate.

2. The evaporation plate of claim 1,
wherein the main body plate is in direct contact with the first cooling layer on the first side, and is in direct contact with the second cooling layer on the second side;
the first cooling layer is in direct contact with the main body plate on one side and is in direct contact with the first heating layer on another side; and
the second cooling layer is in direct contact with the main body plate on one side and is in direct contact with the second heating layer on another side.

3. The evaporation plate of claim 1, further comprising:
a first heat spreading layer on a side of the first heating layer away from the first cooling layer, and configured to distribute heat transmitted from the first heating layer; and
a second heat spreading layer on a side of the second heating layer away from the second cooling layer, and configured to distribute heat transmitted from the second heating layer;
wherein the first cooling layer is configured to cool the first heating layer and the first heat spreading layer on the first side of the main body plate;
the first heating layer is between the first heat spreading layer and the first cooling layer, and is configured to heat a material deposited on the first heat spreading layer through the first heat spreading layer;
the second cooling layer is configured to cool the second heating layer and the second spreading layer on the second side of the main body plate; and
the second heating layer is between the second heat spreading layer and the second cooling layer, and is configured to heat a material deposited on the second heat spreading layer through the second heat spreading layer.

4. The evaporation plate of claim 1, further comprising a pivot configured to rotate the evaporation plate between a first position and a second position.

5. An evaporation apparatus, comprising the evaporation plate of claim 1.

6. The evaporation apparatus of claim 5, further comprising a plurality of nozzles configured to spread an evaporated deposition material onto the evaporation plate.

7. The evaporation apparatus of claim 6,
wherein the main body plate is in direct contact with the first cooling layer on the first side, and is in direct contact with the second cooling layer on the second side;
the first cooling layer is in direct contact with the main body plate on one side and is in direct contact with the first heating layer on another side;
the second cooling layer is in direct contact with the main body plate on one side and is in direct contact with the second heating layer on another side.

8. The evaporation apparatus of claim 6, wherein the evaporation plate further comprises:
a first heat spreading layer on a side of the first heating layer away from the first cooling layer, and configured to distribute heat transmitted from the first heating layer; and
a second heat spreading layer on a side of the second heating layer away from the second cooling layer, and configured to distribute heat transmitted from the second heating layer;
wherein the first cooling layer is configured to cool the first heating layer and the first heat spreading layer on the first side of the main body plate;
the first heating layer is configured to heat a material deposited on the first heat spreading layer through the first heat spreading layer;
the second cooling layer is configured to cool the second heating layer and the second spreading layer on the second side of the main body plate; and
the second heating layer is configured to heat a material deposited on the second heat spreading layer through the second heat spreading layer.

9. The evaporation apparatus of claim 6, wherein the evaporation plate is configured to rotate between a first position and a second position;
wherein the plurality of nozzles face the first side of the main body plate when the evaporation plate is at the first position, and are configured to spread the evaporated deposition material onto the first side of the main body plate at the first position; and
the plurality of nozzles face the second side of the main body plate when the evaporation plate is at the second position, and are configured to spread the evaporated deposition material onto the second side of the main body plate at the second position.

10. The evaporation apparatus of claim 9, wherein the second heating layer is configured to heat a deposition material spread on the second side of the main body plate when the evaporation plate is at the first position; and
the first heating layer is configured to heat a deposition material spread on the first side of the main body plate when the evaporation plate is at the second position.

11. The evaporation apparatus of claim 9, further comprising a pivot coupled to the evaporation plate and configured to rotate the evaporation plate between the first position and the second position.

12. The evaporation apparatus of claim 6, further comprising a deposition-preventing plate between the evaporation plate and the plurality of nozzles;
wherein the deposition-preventing plate has an opening exposing the evaporation plate;
the plurality of nozzles are movable relative to the opening; and
deposition of the evaporated deposition material on the evaporation plate is prevented when the plurality of nozzles are outside a region corresponding to the opening.

13. A method of depositing a deposition material on a substrate, comprising:
providing an evaporation apparatus comprising an evaporation plate and a plurality of nozzles, wherein the evaporation plate comprises a sequentially stacked structure, wherein the sequentially stacked structure comprises a first heating layer; a first cooling layer; a main body plate; a second cooling layer; and a second heating layer, wherein the first cooling layer and the first heating layer are sequentially stacked on a first side of the main body plate; the second cooling layer and the second heating layer are sequentially stacked on a second side of the main body plate; the second side is opposite to the first side; the main body plate is between the first cooling layer and the second cooling layer; the first cooling layer is between the first heating layer and the main body plate, and is configured to cool the first heating layer on the first side of the main body plate; the first heating layer is configured to heat a first material deposited on the first side of the main body plate; the second cooling layer is between the second heating layer and the main body plate, and is configured to cool the second heating layer on the second side of the main body plate; and the second heating layer is configured to heat a second material deposited on the second side of the main body plate;

setting the evaporation plate to the first position, at which the plurality of nozzles face the first side of the main body plate;

depositing the evaporated deposition material from the plurality of nozzles onto the first side of the main body plate at the first position, thereby forming a first deposition material layer;

setting the evaporation plate to the second position, at which the plurality of nozzles face the second side of the main body plate; and depositing the evaporated deposition material from the plurality of nozzles onto the second side of the main body plate at the second position, thereby forming a second deposition material layer.

14. The method of claim 13, wherein the evaporation apparatus further comprises a deposition-preventing plate between the evaporation plate and the plurality of nozzles;

the deposition-preventing plate has an opening exposing the evaporation plate;

the plurality of nozzles are movable relative to the opening; and deposition of the evaporated deposition material on the evaporation plate is prevented when the plurality of nozzles are outside a region corresponding to the opening;

wherein subsequent to forming the first deposition material layer and prior to setting the evaporation plate to the second position, the method further comprises:

moving the plurality of nozzles outside the region corresponding to the opening.

15. The method of claim 13, further comprising:

providing a first substrate on a side of the first heating layer away from the main body plate;

providing a first mask plate on a side of the first substrate closer to the first heating layer;

heating the first heating layer when the evaporation plate is at the second position to heat the first deposition material layer to a temperature such that a first deposition material in the first deposition material layer is evaporated; and depositing the first deposition material on the first substrate.

16. The method of claim 15, subsequent to depositing the first deposition material, further comprising:

cooling the first cooling layer to lower the temperature of the first heating layer;

setting the evaporation plate to the first position; and depositing the evaporated deposition material from the plurality of nozzles onto the first side of the main body plate at the first position, thereby forming a first deposition material layer.

17. The method of claim 16, further comprising:

providing a second substrate on a side of the second heating layer away from the main body plate;

providing a second mask plate on a side of the second substrate closer to the second heating layer;

heating the second heating layer when the evaporation plate is at the first position to heat the second deposition material layer to a temperature such that a second deposition material in the second deposition material layer is evaporated; and depositing the second deposition material on the second substrate.

18. A display apparatus, wherein at least one layer of the display apparatus is fabricated by the method of claim 13.

19. The display apparatus of claim 18, wherein the display apparatus is an organic light emitting diode display apparatus; and the at least one layer comprises an organic light emitting layer.

20. The evaporation apparatus of claim 1, wherein the first cooling layer is a layer continuously extending substantially over an entirety of a first surface of the main body plate; and the second cooling layer is a layer continuously extending substantially over an entirety of a second surface of the main body plate.

* * * * *